(12) United States Patent
Kitamura et al.

(10) Patent No.: US 10,248,000 B2
(45) Date of Patent: Apr. 2, 2019

(54) SEMICONDUCTOR OPTICAL ELEMENT AND METHOD FOR MANUFACTURING THE SAME

(71) Applicant: SUMITOMO ELECTRIC INDUSTRIES, LTD., Osaka (JP)

(72) Inventors: Takamitsu Kitamura, Yokohama (JP); Masataka Watanabe, Yokohama (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 15/914,826

(22) Filed: Mar. 7, 2018

(65) Prior Publication Data

US 2018/0275482 A1 Sep. 27, 2018

(30) Foreign Application Priority Data

Mar. 23, 2017 (JP) .................. 2017-058070

(51) Int. Cl.
| | |
|---|---|
| *G02F 1/225* | (2006.01) |
| *H01S 5/026* | (2006.01) |
| *G02F 1/025* | (2006.01) |
| *H01S 5/12* | (2006.01) |
| *H01S 5/227* | (2006.01) |
| *H01L 23/00* | (2006.01) |

(Continued)

(52) U.S. Cl.
CPC ............ *G02F 1/2257* (2013.01); *G02F 1/025* (2013.01); *H01L 21/76826* (2013.01); *H01L 21/76829* (2013.01); *H01L 24/05* (2013.01); *H01L 24/45* (2013.01); *H01L 24/48* (2013.01); *H01L 24/85* (2013.01); *H01S 5/0265* (2013.01); *H01S 5/0425* (2013.01); *H01S 5/12* (2013.01); *H01S 5/227* (2013.01)

(58) Field of Classification Search
CPC . G02F 1/2257; G02F 1/025; H01L 21/76826; H01L 21/76829; H01L 24/05; H01L 24/45; H01L 24/48; H01L 24/85; H01S 5/0265; H01S 5/0425; H01S 5/12; H01S 5/227

See application file for complete search history.

(56) References Cited

U.S. PATENT DOCUMENTS

| | | | |
|---|---|---|---|
| 2012/0058635 A1 | 3/2012 | Tsuji | |
| 2012/0314725 A1 | 12/2012 | Nakanishi et al. | |
| 2015/0023627 A1* | 1/2015 | Kimura ................ | G02F 1/2257 385/3 |

FOREIGN PATENT DOCUMENTS

| | | |
|---|---|---|
| JP | 2002-232004 | 8/2002 |
| JP | 2012-59843 | 3/2012 |

(Continued)

*Primary Examiner* — Armando Rodriguez
(74) *Attorney, Agent, or Firm* — Smith, Gambrell & Russell, LLP.

(57) ABSTRACT

A semiconductor optical element is disclosed. The semiconductor optical element includes: a mesa-shaped optical waveguide formed on a substrate; a modulation electrode formed on the optical waveguide; a first resin layer that buries side surfaces of the optical waveguide; a bonding pad formed on the first resin layer; and a connecting wiring line that connects the modulation electrode and the bonding pad. In the semiconductor optical element, side surfaces of the bonding pad are partially covered with a second resin layer provided on the first resin layer, and the connecting wiring line extends on the second resin layer.

9 Claims, 15 Drawing Sheets

(51) Int. Cl.
*H01L 21/768* (2006.01)
*H01S 5/042* (2006.01)

(56) References Cited

FOREIGN PATENT DOCUMENTS

| | | |
|---|---|---|
| JP | 2012-252290 | 12/2012 |
| JP | 2015-21974 | 2/2015 |
| JP | 5795970 | 8/2015 |

* cited by examiner

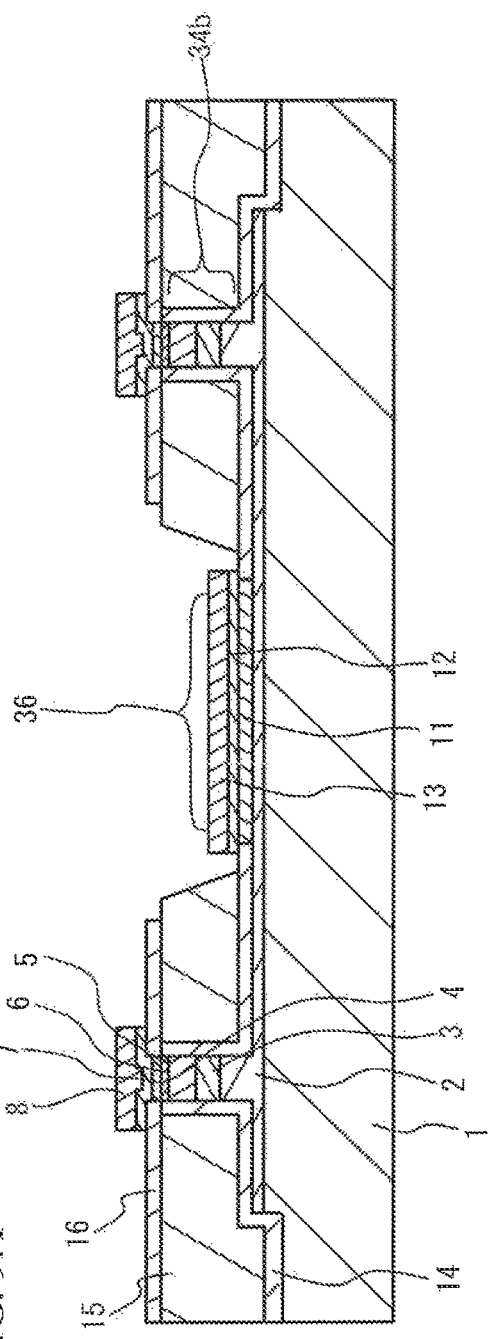
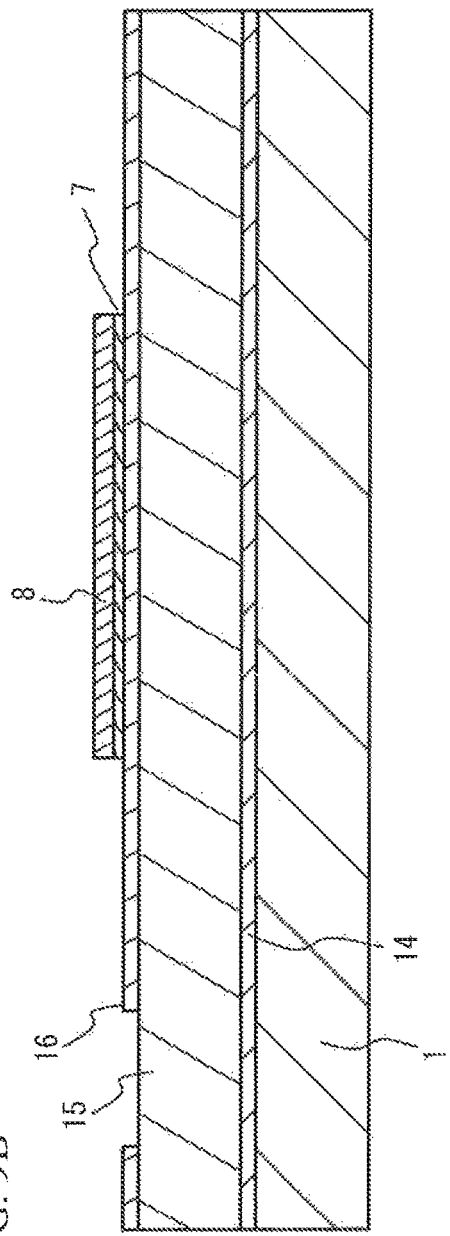
FIG. 9A
FIG. 9B

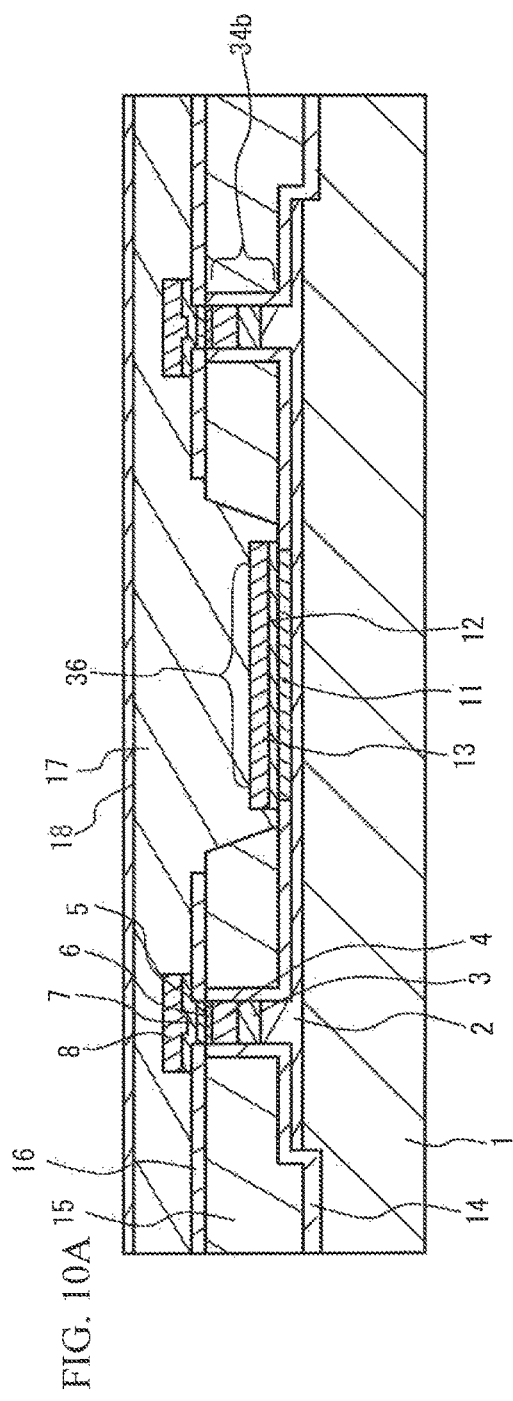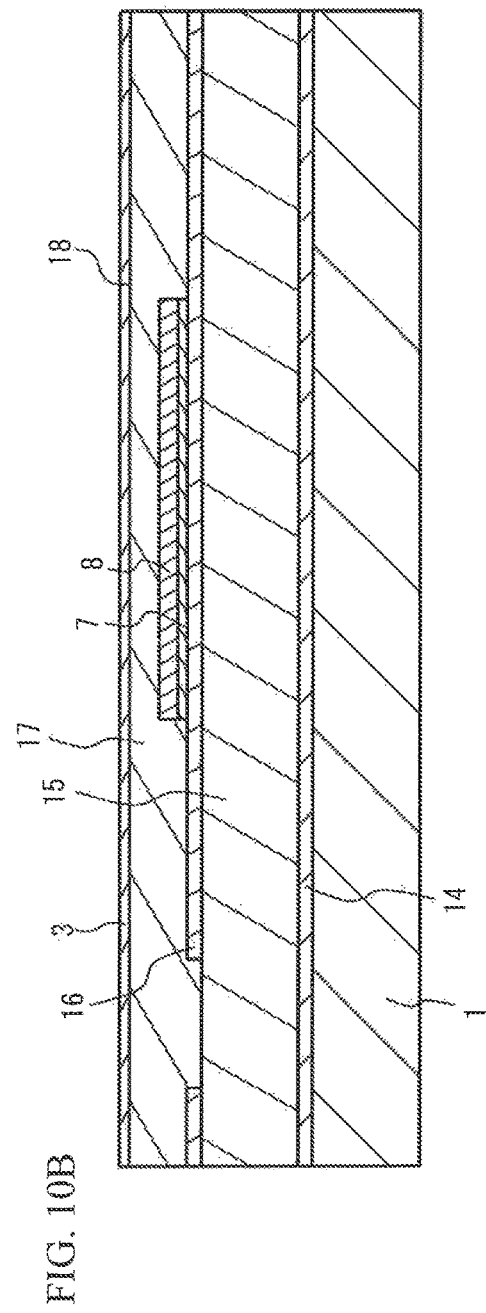

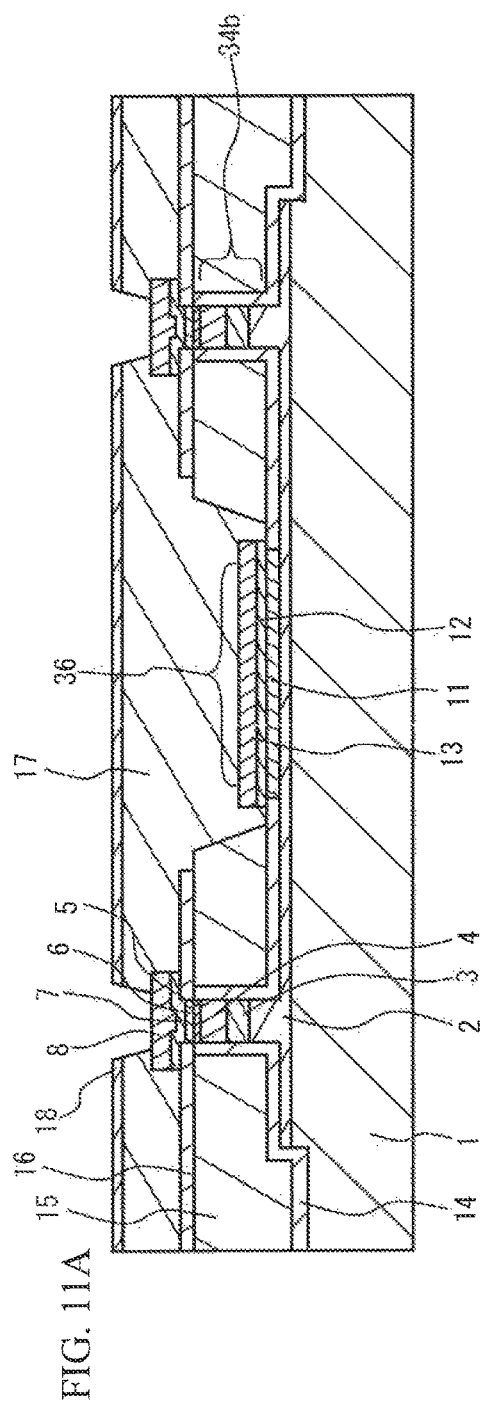
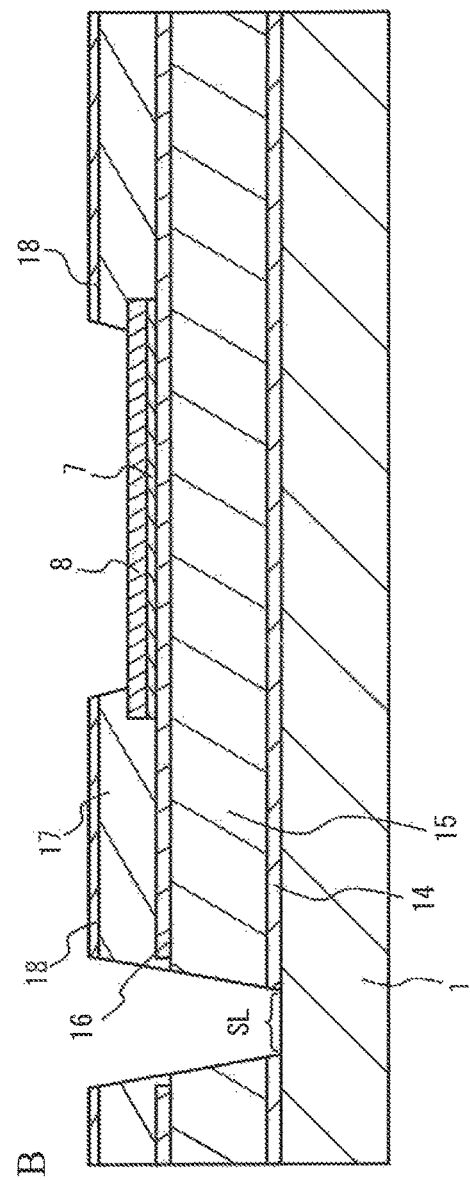
FIG. 11A
FIG. 11B

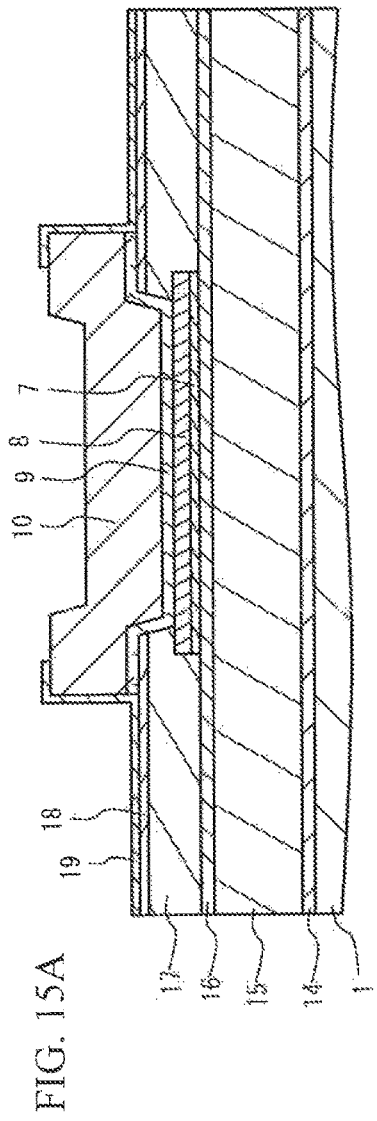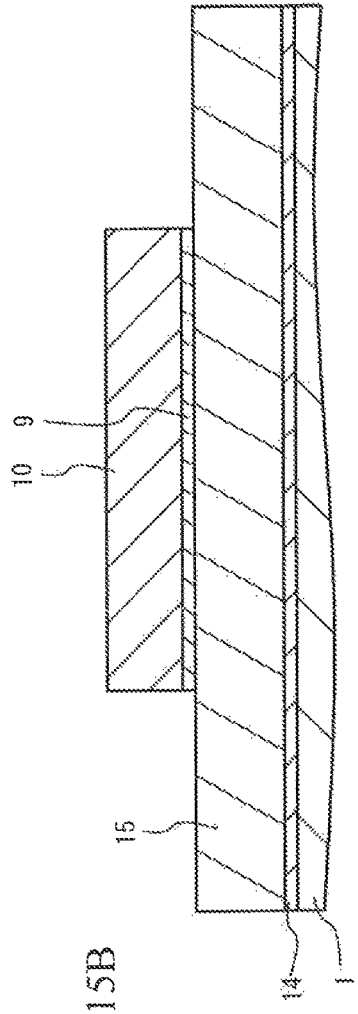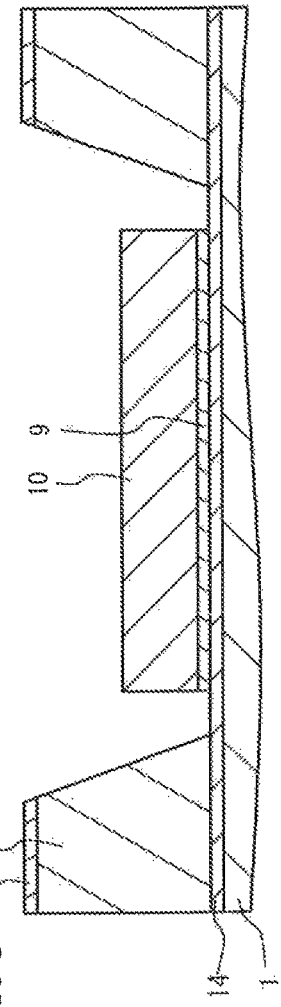
FIG. 15A
FIG. 15B
FIG. 15C

SEMICONDUCTOR OPTICAL ELEMENT AND METHOD FOR MANUFACTURING THE SAME

CROSS-REFERENCE TO RELATED APPLICATION

This application is based upon and claims the benefit of priority of the prior Japanese Patent Application No. 2017-058070, filed on Mar. 23, 2017, the entire contents of which are incorporated herein by reference.

BACKGROUND

(i) Technical Field

The present invention relates to a semiconductor optical element and a method of manufacturing the semiconductor optical element.

(ii) Related Art

Japanese Patent Application Laid-Open No. 2002-232004 discloses an LED array that is provided on a substrate and includes an organic insulating film as a protection film. Japanese Patent Application Laid-Open No. 2002-232004 teaches that, in a case where electrode pads made of a metal are provided on an organic insulating film, defective connections occur due to the low adhesion between the metal and the organic insulating film when wire bonding is performed on the electrode pads. Therefore, in the LED array according to Japanese Patent Application Laid-Open No. 2002-232004, electrode pads are not provided on an organic insulating film, but are provided on a substrate on which any organic insulating film is not provided. The light-emitting elements of the LEDs are electrically connected to the electrode pads on the substrate by extension wiring lines that extend on the organic insulating film.

Japanese Patent Application Laid-Open No. 2012-252290 discloses a Mach-Zehnder modulator of a semiconductor high-mesa optical waveguide. The mesa height is approximately 4 to 5 μm, and the mesas are buried with resin. The electrode pads for wire bonding are provided on the resin. The connecting portions that connect the electrodes on optical waveguides and the electrode pads extend on the resin.

SUMMARY

Where bonding pads are provided on resin as disclosed in Japanese Patent Application Laid-Open No. 2012-252290, the bonding pads are easily detached from the resin, because the adhesion strength between the resin and the bonding pads is low. However, if bonding pads are provided on portions on which any resin film is not formed (or on the substrate) as in Japanese Patent Application Laid-Open No. 2002-232004, steps are formed due to the great thickness of the resin in Japanese Patent Application Laid-Open No. 2012-252290, and these steps make connections between the wiring lines and the bonding pads difficult.

Therefore, the present invention aims to facilitate connections between wiring lines and bonding pads while increasing the adhesion strength between resin and the bonding pads.

According to an aspect of the present invention, there is provided a semiconductor optical element, including: a mesa-shaped optical waveguide formed on a substrate; a modulation electrode formed on the optical waveguide; a first resin layer that buries side surfaces of the optical waveguide; a bonding pad formed on the first resin layer; and a connecting wiring line that connects the modulation electrode and the bonding pad, wherein side surfaces of the bonding pad are partially covered with a second resin layer provided on the first resin layer, and the connecting wiring line extends on the second resin layer.

BRIEF DESCRIPTION OF THE DRAWINGS

FIGS. 9A and 9B are cross-sectional diagrams illustrating the method of manufacturing the semiconductor optical element according to the first embodiment;

FIGS. 10A and 10B are cross-sectional diagrams illustrating the method of manufacturing the semiconductor optical element according to the first embodiment;

FIGS. 11A and 11B are cross-sectional diagrams illustrating the method of manufacturing the semiconductor optical element according to the first embodiment;

FIGS. 15A through 15C are diagrams illustrating an example and comparative examples.

DETAILED DESCRIPTION

Figure 1:
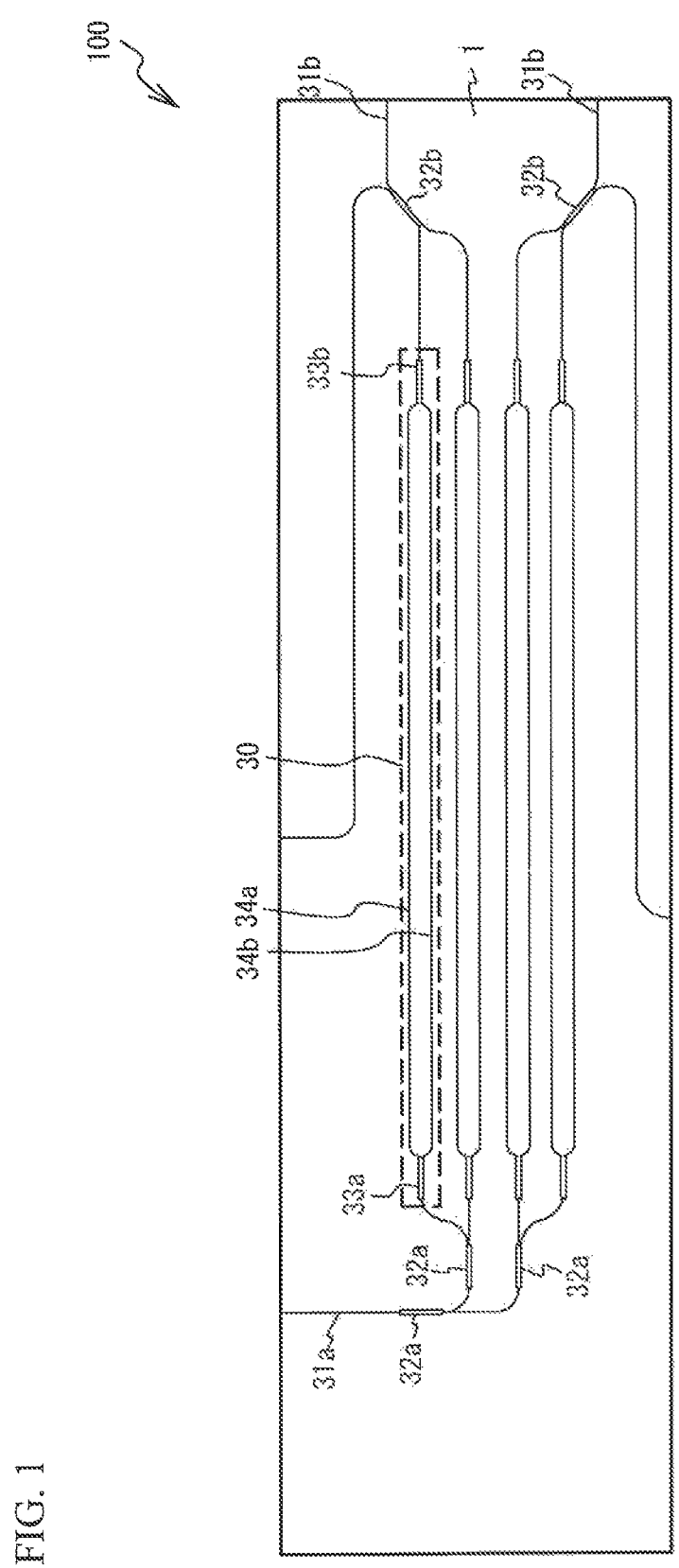
FIG. 1 is a plan view of an optical waveguide portion of a semiconductor optical element according to a first embodiment.

Description of Embodiments of the Present Invention

First, the contents of embodiments of the present invention are listed below.

An aspect of the present invention is 1) a semiconductor optical element that includes: a mesa-shaped optical waveguide formed on a substrate; a modulation electrode formed on the optical waveguide; a first resin layer that buries the side surfaces of the optical waveguide; a bonding pad formed on the first resin layer; and a connecting wiring line that connects the modulation electrode and the bonding pad, wherein the side surfaces of the bonding pad are partially covered with a second resin layer provided on the first resin layer, and the connecting wiring line extends on the second resin layer.

2) The bonding pad may have a structure in which an upper region is stacked on the upper surface of a lower region, the width of the upper region may be smaller than the width of the lower region in the stacking plane between the lower region and the upper region, and a region where the upper region is not provided on the upper surface of the lower region may be covered with the second resin layer.

3) The thickness of the upper region may be greater than the thickness of the second resin layer.

4) The semiconductor optical element may further include a first inorganic film between the first resin layer and the bonding pad.

5) The semiconductor optical element may further include: a second inorganic film provided on the second resin layer; and a third inorganic film provided on the second inorganic film, wherein the bonding pad may extend to the upper surface of the second resin layer, and the rim of a portion of the bonding pad may be vertically interposed between the second inorganic film and the third inorganic film, the portion of the bonding pad extending to the upper surface of the second resin layer.

6) The first resin layer may be harder than the second resin layer.

7) The same semiconductor stack structure as the mesa-shaped optical waveguide may be provided on the substrate at a portion between a side surface of the semiconductor optical element closest to the bonding pad, and the bonding pad.

Another aspect of the present invention is 8) a semiconductor optical element manufacturing method that includes the steps of: burying the side surfaces of a mesa-shaped optical waveguide with a first resin layer, the mesa-shaped optical waveguide being provided on a substrate; forming a modulation electrode on the optical waveguide; forming a bonding pad on the first resin layer; forming a second resin layer on the first resin layer; and forming a connecting wiring line that connects the modulation electrode and the bonding pad, and extends on the second resin layer, wherein, when the second resin layer is formed, the side surfaces of the bonding pad are partially covered with the second resin layer.

9) The step of burying the side surfaces with the first resin layer may include subjecting the first resin layer to thermal hardening treatment, and the step of forming the second resin layer may include subjecting the second resin layer to thermal hardening treatment.

Detailed Description of Embodiments of the Present Invention

The following is a description of specific examples of a semiconductor optical element and a method of manufacturing the semiconductor optical element according to an embodiment of the present invention, with reference to the accompanying drawings. It should be noted that the present invention is not limited to these examples but is shown by the claims, and it is intended that all modifications are included in the equivalents of the claims and the scope of the claims. Further, some other components may be included, as long as the effects of the present invention can be achieved.

First Embodiment

FIG. 1 is a plan view of an optical waveguide portion of an optical modulator 100 that is a semiconductor optical element according to a first embodiment. As shown in FIG. 1, the optical modulator 100 according to the first embodiment has the following components on a substrate 1: an input waveguide 31a, output waveguides 31b, optical couplers 32a and 32b, and Mach-Zehnder modulators 30. The input waveguide 31a, the output waveguides 31b, and the optical couplers 32a and 32b are formed with mesa-shaped optical waveguides. The optical couplers 32a and 32b are Multimode-Interferometer (MMI) optical couplers. The Mach-Zehnder modulators 30 are a combination of paths formed with mesa-shaped optical waveguides. Light that is input from the input waveguide 31a is divided by the optical couplers 32a. After passing through the Mach-Zehnder modulators 30, the light is multiplexed by the optical couplers 32b, and is output to the output waveguides 31b. The size of the optical modulator 100 is 10 mm×4 mm, for example.

Each Mach-Zehnder modulator 30 includes the following components on the substrate 1: two optical couplers 33a and 33b, and two arm waveguides 34a and 34b connected between the two optical couplers 33a and 33b. The optical couplers 33a and 33b and the arm waveguides 34a and 34b are formed with mesa-shaped optical waveguides. The optical coupler 33a divides light input from the input waveguide 31a. The two arm waveguides 34a and 34b transmit the light divided by the optical coupler 33a. The optical coupler 33b combines the light transmitted through the two arm waveguides 34a and 34b. The optical couplers 33a and 33b are MMI optical couplers.

Figure 2:
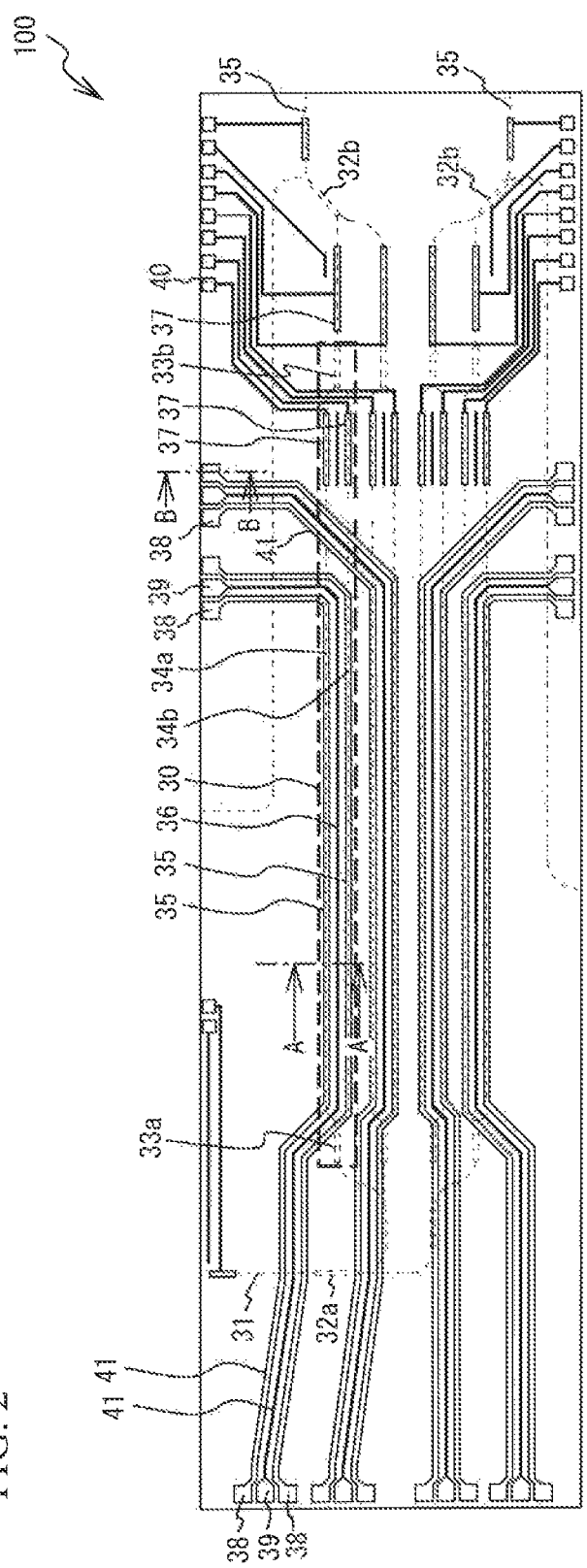
FIG. 2 is a plan view of the semiconductor optical element according to the first embodiment.

FIG. 2 is a plan view of the optical modulator 100 according to the first embodiment. In FIG. 2, the optical waveguide portion described above with reference to FIG. 1 is indicated by thin dotted lines. In the optical modulator 100 according to the first embodiment, the mesa-shaped optical waveguides are buried with resin.

A wiring pattern includes modulation electrodes 35, a ground electrode 36, and phase regulation electrodes 37. The modulation electrodes 35 are provided on the arm waveguides 34a and 34b of the Mach-Zehnder modulator 30, and are connected to signal bonding pads 38 via connecting wiring lines 41. The ground electrode 36 is provided between the arm waveguides 34a and 34b, and is connected to ground bonding pads 39 via a connecting wiring line 41. The phase regulation electrodes 37 are provided at different positions from the modulation electrodes 35 on the arm waveguides 34a and 34b of the Mach-Zehnder modulator 30, and are connected to DC electrode pads 40.

When a high-frequency electric signal is supplied from the bonding pads 38 to the modulation electrodes 35, an electric signal at a high frequency (about 20 GHz, for example) flows between the ground electrode 36 and each modulation electrode 35. Because of this, the refractive index of the arm waveguides 34a and 34b changes, and the phase of the light propagating through the arm waveguides 34a and 34b changes. As a result, the light propagating through the arm waveguides 34a and 34b is subjected to phase modulation, and is turned into a modulated optical signal to be output to the output waveguide 31b.

When a direct-current (DC) voltage is supplied from the DC electrode pads 40 to the phase regulation electrodes 37, the refractive index of the arm waveguides 34a and 34b shifts by a certain value. The DC voltage is set at such a value (optimum value) that the light propagating through the arm waveguides 34a and 34b is properly modulated by the electric signal supplied to the modulation electrodes 35. That is, the phase of the light propagating through the arm waveguides 34a and 34b is adjusted by the phase regulation electrodes 37 so that the light propagating through the arm waveguides 34*a* and 34*b* is properly modulated.

The optimum value of the DC voltage to be supplied to the phase regulation electrodes 37 depends on the optical path length difference between the arm waveguides 34*a* and 34*b*. The optical path length difference between the arm waveguides 34*a* and 34*b* varies with the wavelength of the light propagating through the arm waveguides 34*a* and 34*b*, for example. Light of a first wavelength enters the optical modulator 100 at a first instant, and the wavelength switches to another wavelength and light of a second wavelength enters the optical modulator 100 at a second instant, with the wavelengths being in the range of 1530 to 1570 nm, for example. Therefore, a table showing the relationship between the wavelength of incident light and the value of the DC voltage to be supplied is created in advance, and the value of the DC voltage is determined in accordance with the relationship table at a time of operation. The optical path length difference between the arm waveguides 34*a* and 34*b* also varies with the temperature difference between the arm waveguides 34*a* and 34*b*. Therefore, the optical modulator 100 is mounted on a thermoelectric cooler (TEC), and is maintained at a constant temperature (70 degrees C., for example) at times of use.

Figure 3:
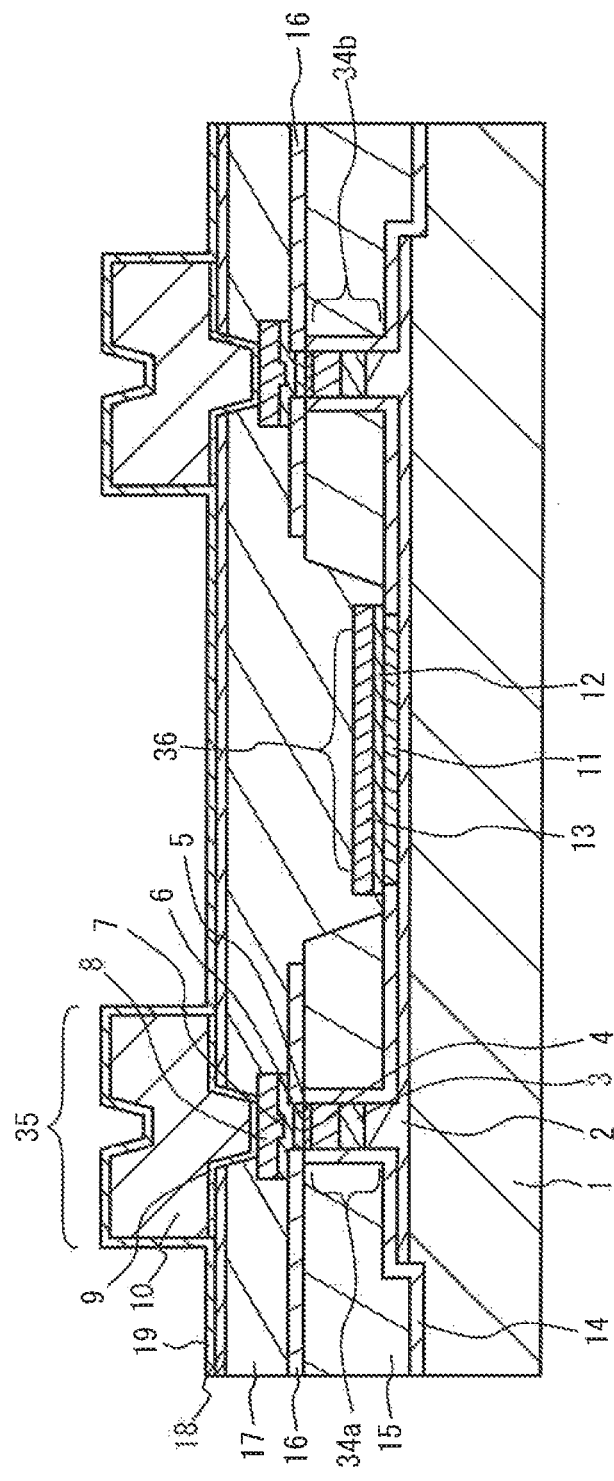
FIG. 3 is a cross-sectional view taken along the line A-A defined in FIG. 2.

FIG. 3 is a cross-sectional view taken along the line A-A defined in FIG. 2. That is, FIG. 3 shows a cross-section perpendicular to the optical waveguide direction in a region including the arm waveguides 34*a* and 34*b*. As shown in FIG. 3, a lower clad layer 2 of n-type InP (Si-added InP, for example) is provided on the substrate 1 of semi-insulating InP, for example. The lower clad layer 2 is provided across the region extending from the arm waveguide 34*a* to the arm waveguide 34*b*. At the positions corresponding to the arm waveguides 34*a* and 34*b* on the lower clad layer 2, core layers 3 having a multiquantum well structure that includes an AlGaInAs well layer and an AlInAs barrier layer are provided. An upper clad layer 4 of p-type InP (Zn-added InP, for example) is formed on each core layer 3. A p-type (Zn-added) GaInAs contact layer 5 is formed on each upper clad layer 4. In this manner, the arm waveguides 34*a* and 34*b* that are formed with mesa-shaped optical waveguides, share the lower clad layer 2, and are electrically connected to each other are formed on the substrate 1. The distance between the arm waveguide 34*a* and the arm waveguide 34*b* is approximately 50 µm. The arm waveguides 34*a* and 34*b* each include the lower clad layer 2, a core layer 3, an upper clad layer 4, and a contact layer 5. The mesa height is approximately 3 µm, for example. The mesa width is approximately 1.5 µm, for example.

An n-electrode 11 in contact with the upper surface of the lower clad layer 2, a TiW foundation layer 12 in contact with the upper surface of the n-electrode 11, and a gold (Au) layer 13 are stacked in this order between the arm waveguide 34*a* and the arm waveguide 34*b*. The n-electrode 11, the foundation layer 12, and the Au layer 13 function as the ground electrode 36.

Outside the region where the ground electrode 36 is provided, a protection film 14 formed with a 0.3-µm thick $SiO_2$ film, for example, is provided on the substrate 1, the lower clad layer 2, and the mesa side surfaces of the arm waveguides 34*a* and 34*b*. The mesa side surfaces are buried with a 3-µm thick first resin layer 15 of benzocyclobutene (BCB) via the protection film 14. The first resin layer 15 is not provided on the ground electrode 36. A 0.3-µm thick first inorganic film 16 of SiON or the like is formed on the first resin layer 15.

Ohmic layers 6 (Ti/Pt/Au) in contact with the contact layers 5 are provided on the contact layers 5. A 0.3-µm thick first foundation layer 7 of TiW and a 1-µm thick first Au layer 8 are stacked in this order on each ohmic layer 6. The width of each ohmic layer 6 is 1 µm, each first foundation layer 7, and each first Au layer 8 is approximately 4 µm. This width is greater than the width of the arm waveguides 34*a* and 34*b*, and the ohmic layer 6 formed within the top of the mesa.

A 2.3-µm thick second resin layer 17 of BCB that buries portions ranging from the side surfaces of the first foundation layers 7 and the first Au layers 8 to the upper surface of the rim portions of the first Au layers 8 is provided on the first inorganic film 16. The second resin layer 17 is designed to cover the irregularities formed by the arm waveguides 34*a* and 34*b* and the ground electrode 36, so that the upper surface of the second resin layer 17 becomes flat. A second inorganic film 18 of $SiO_2$ or the like is provided on the second resin layer 17. Openings that reach the upper surfaces of the first Au layers 8 are formed in the second resin layer 17 and the second inorganic film 18. Through these openings, 0.3-µm thick second foundation layers 9 of TiW and 4.5-µ thick second Au layers 10 extend from the upper surfaces of the first Au layers 8 to the upper surface of the second inorganic film 18. The ohmic layers 6, the first foundation layers 7, the first Au layers 8, the second foundation layers 9, and the second Au layers 10 function as the modulation electrodes 35. A third inorganic film 19 of SiON/SiN or the like is provided to cover the second inorganic film 18 and the second Au layers 10. With this, the upper surfaces and the side surfaces of the second Au layers 10 extending to the upper surface of the second inorganic film 18 and the upper surface of the second inorganic film 18 are covered with the continuous third inorganic film 19. The side surfaces of the second foundation layers 9 are partially covered with the second resin layer 17. Thus, the modulation electrodes 35 are prevented from being easily detached from the second resin layer 17 and the second inorganic film 18.

The connecting wiring lines 41 (FIG. 2) connecting the modulation electrodes 35 and the bonding pads 38 each have a structure in which a second foundation layer 9 and a second Au layer 10 are stacked, and extend on the second inorganic film 18. The ground electrode 36 is connected to the connecting wiring line 41 (FIG. 2) connected to the bonding pads 39 at predetermined portions. The connecting wiring line 41 connecting the ground electrode 36 and the bonding pads 39 also has a structure in which a second foundation layer 9 and a second Au layer 10 are stacked, and extend on the second inorganic film 18.

Figure 4:
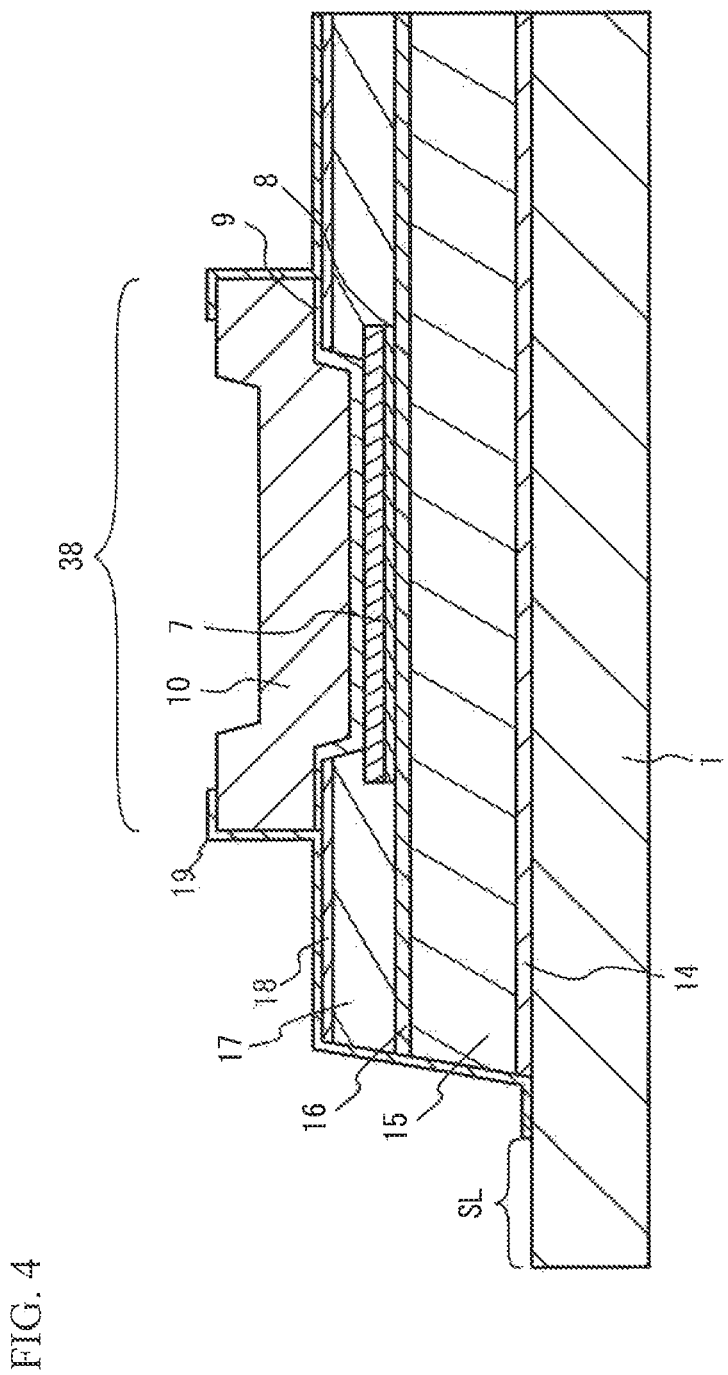
FIG. 4 is a cross-sectional view taken along the line B-B defined in FIG. 2.

FIG. 4 is a cross-sectional view taken along the line B-B defined in FIG. 2. That is, FIG. 4 shows a cross-section of the region where a bonding pad 38 is provided. It should be noted that each bonding pad 39 has a similar structure, but only a bonding pad 38 is described below, for ease of explanation.

As shown in FIG. 4, in the region where a bonding pad 38 is provided, the first resin layer 15 is provided on the substrate 1 via the protection film 14. The first inorganic film 16 is provided on the first resin layer 15. The bonding pad 38 has a structure in which the first foundation layer 7, the first Au layer 8, the second foundation layer 9, and the second Au layer 10 are stacked in this order on the first inorganic film 16. The first foundation layer 7 and the first Au layer 8 are called the lower region. The second foundation layer 9 and the second Au layer 10 are called the upper region. At the portion where the lower region and the upper region are stacked, the width of the upper region is 150 µm, for example, and the width of the lower region is 140 μm, for example. That is, at the portion where the lower region and the upper region are stacked, the area of the upper region is smaller than the area of the lower region.

The second resin layer 17 is provided on the first inorganic film 16, and covers the side surfaces of the lower region and the region on the upper surface of the lower region on which the upper region is not provided. The second resin layer 17 and the second inorganic film 18 have an opening on the first Au layer 8. Through the opening, the second foundation layer 9 and the second Au layer 10 extend from the upper surface of the first Au layer 8 to the upper surface of the second inorganic film 18. The second foundation layer 9 has a recessed portion (or has a saucer-shaped structure), the central portion thereof being lower, the rim portion thereof being higher. The inside of the recessed portion is filled with the second Au layer 10. Since the second foundation layer 9 and the second Au layer 10 are metals, the adhesion at the contact interface is high. Thus, detachment does not easily occur between the stacked layers in the bonding pad 38.

The third inorganic film 19 covers the rim portion of the upper surface of the second Au layer 10 and the upper surface of the second inorganic film 18, and also covers the side surfaces of the first resin layer 15 and the second resin layer 17, as well as part of the surface of the substrate 1. The third inorganic film 19 continuously covers the region extending from the end portion of the second Au layer 10 of the bonding pad 38 to the upper surface of the second inorganic film 18. The second Au layer 10 and the second foundation layer 9 of the bonding pad 38 have their rim portions vertically interposed between the second inorganic film 18 and the third inorganic film 19. The center of the second Au layer 10 is exposed through the third inorganic film 19 so that a bonding wire can be connected thereto.

In the first embodiment, the connecting wiring line 41 extends on the second resin layer 17, and the bonding pad 38 is formed on the first resin layer 15. Accordingly, the step can be made smaller than in a case where the bonding pad 38 is provided on the substrate 1, without any resin layer being interposed in between. In this manner, the connecting wiring line 41 and the bonding pad 38 can be easily connected. The side surface of the lower region of the bonding pad 38 is covered with the second resin layer 17, and the first resin layer 15 and the second resin layer 17 are connected by the first inorganic film 16, so that high adhesion is achieved between the first resin layer 15 and the second resin layer 17. This is because the resin and the inorganic film (especially in the presence of oxygen) are chemically bonded to each other while the resin and the metal are not easily bonded chemically to each other. Consequently, high adhesion is achieved between the bonding pad 38 and the first resin layer 15. For the above reasons, the connecting wiring line 41 and the bonding pad 38 can be easily connected while the adhesion strength between the first resin layer 15 and the bonding pad 38 is increased.

Further, as the second resin layer 17 covers the rim portion of the upper surface of the lower region of the bonding pad 38, the adhesion between the bonding pad 38 and the second resin layer 17 becomes higher.

As the first foundation layer 7 is not provided directly on the first resin layer 15 but is provided above the first resin layer 15 via the first inorganic film 16, high adhesion is achieved between the first foundation layer 7 and the first resin layer 15. This is because the adhesion between the resin and the inorganic film is high, and the adhesion between the inorganic film and the foundation layer is also high (because the oxygen in the inorganic film and the Ti in the foundation layer are bonded to each other).

High adhesion is also achieved between the second resin layer 17 and the second inorganic film 18. Further, as the second inorganic film 18 and the third inorganic film 19 are inorganic films of the same kind, high adhesion is achieved between these inorganic films. Accordingly, the rim portion of the upper region of the bonding pad 38 is vertically interposed between the second inorganic film 18 and the third inorganic film 19, so that the adhesion between the second resin layer 17 and the bonding pad 38 becomes higher.

Since the thickness of the second resin layer 17 is approximately 2.3 μm, the connecting wiring line 41 and the bonding pad 38 are connected via a step equivalent to the thickness of the second resin layer 17. The thickness of the bonding pad 38 and the connecting wiring line 41 (or the thickness of the second foundation layer 9 and the second Au layer 10) is approximately 4.5 μm, which is greater than the thickness of the second resin layer 17 or the step at the connecting portion. With this, the connecting wiring line 41 and the bonding pad 38 are connected, without disconnection. Therefore, the thickness of the second resin layer 17 is preferably smaller than the thickness of the second foundation layer 9 and the second Au layer 10.

The first resin layer 15 is preferably designed to be harder than the second resin layer 17. In this case, the difference in thermal expansion/contraction between the first inorganic film 16 and the first foundation layer 7 is small. The difference in thermal expansion/contraction between the first resin layer 15, and the substrate 1 and the protection film 14 is also small. With this arrangement, detachment hardly occurs among the substrate 1, the protection film 14, the first resin layer 15, the first inorganic film 16, and the first foundation layer 7. Further, as the end portion of the first Au layer 8 and the side surfaces of the second foundation layer 9 are covered with the second resin layer 17 that is relatively soft, changes in volume due to thermal expansion/contraction of the first Au layer 8 and the second Au layer 10, and stress due to such changes can be absorbed by the second resin layer 17. As the bonding pad 38 is surrounded by the second resin layer 17, the bonding pad 38 is not easily detached from the second resin layer 17.

Also, the second Au layer 10 and the second foundation layer 9 are shared among the modulation electrode 35, the connecting wiring line 41, and the bonding pad 38, and are continuously and integrally formed. With this arrangement, the unreadiness of the connecting wiring line 41 for detachment and the unreadiness of the modulation electrode 35 for detachment contribute to the unreadiness of the bonding pad 38 for detachment.

It should be noted that regions of scribe lines SL are formed in portions where neither protection films nor resin layers are provided on the substrate 1, and the substrate 1 is exposed. Accordingly, the substrate 1 is partially scribed on the scribe lines SL, so that the substrate 1 can be cleaved along the scribed portions, and chips can be linearly and easily divided.

Next, a method of manufacturing the optical modulator 100 as a semiconductor optical element according to the first embodiment is described. FIGS. 5A through 13B are cross-sectional diagrams illustrating the method of manufacturing the optical modulator 100 according to the first embodiment. In each diagram, A shows a cross-section taken along the line A-A defined in FIG. 2, and B shows a cross-section taken along the line B-B defined in FIG. 2. In the description below, a bonding pad 38 is described, but each bonding pad 39 can be manufactured by a similar manufacturing process.

Figure 5A:
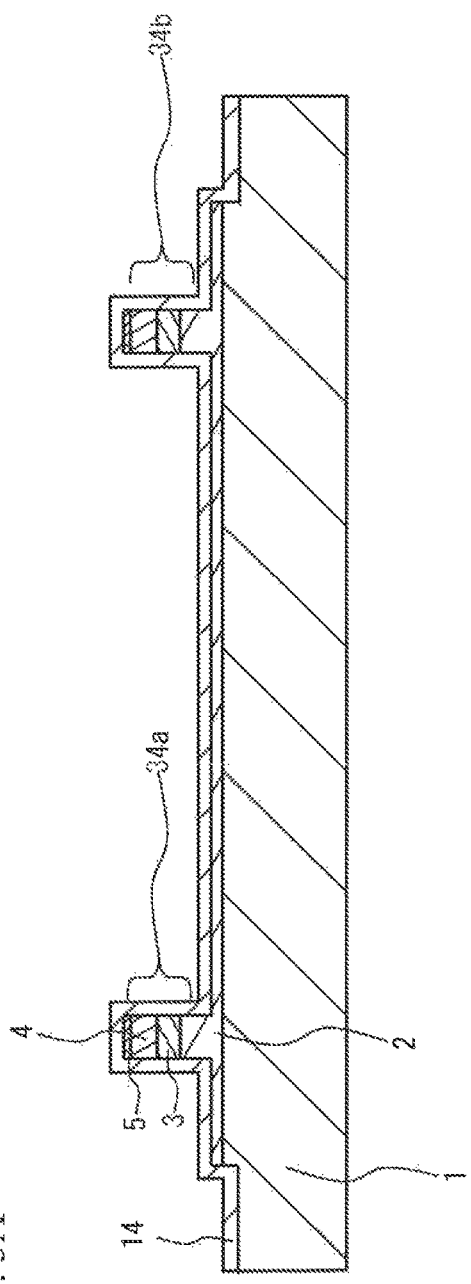
FIGS. 5A and 5B are cross-sectional diagrams illustrating a method of manufacturing the semiconductor optical element according to the first embodiment.
Figure 5B:
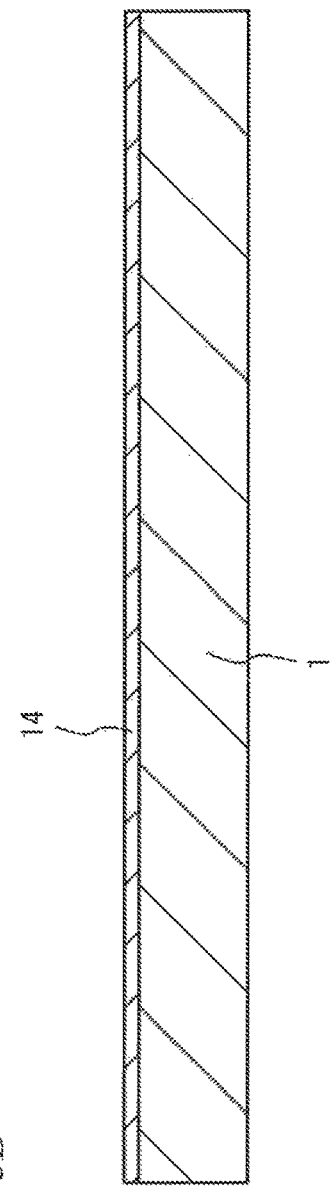

First, as shown in FIG. 5A, crystal growth of the materials to form the lower clad layer 2, the core layers 3, the upper clad layers 4, and the contact layers 5 is conducted by metal organic vapor-phase epitaxy (MOVPE). Mesa-shaped optical waveguides are formed by photolithography and dry etching. Processing is further performed so that the portions of the lower clad layer 2 other than the portion of the lower clad layer 2 located between the arm waveguides 34a and 34b are removed by photolithography and dry etching. The protection film 14 to cover the substrate 1, the arm waveguides 34a and 34b, and the lower clad layer 2 is then formed by thermal CVD. As shown in FIG. 5B, in the cross-section along the line B-B, the protection film 14 is formed on the substrate 1.

Figure 6A:
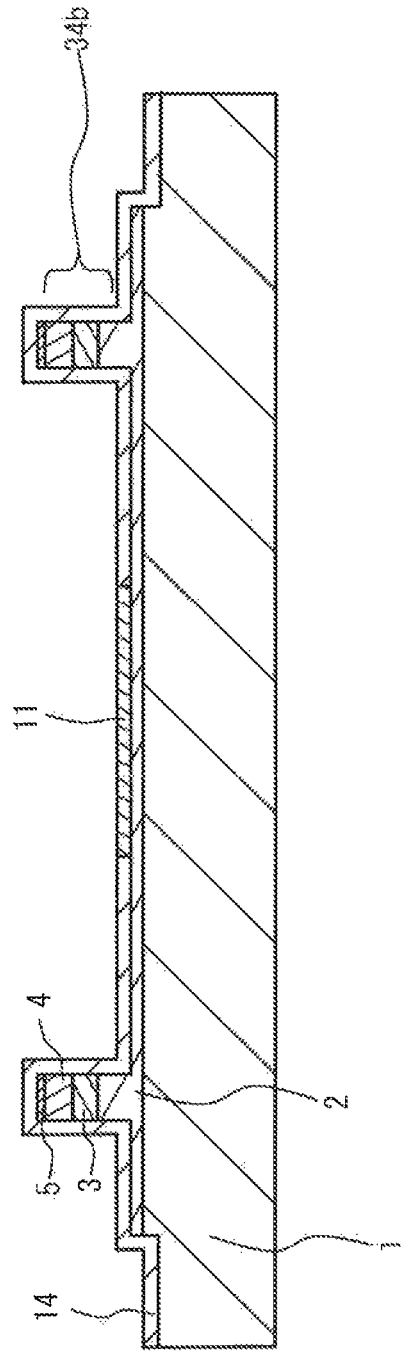
FIGS. 6A and 6B are cross-sectional diagrams illustrating the method of manufacturing the semiconductor optical element according to the first embodiment.
Figure 6B:
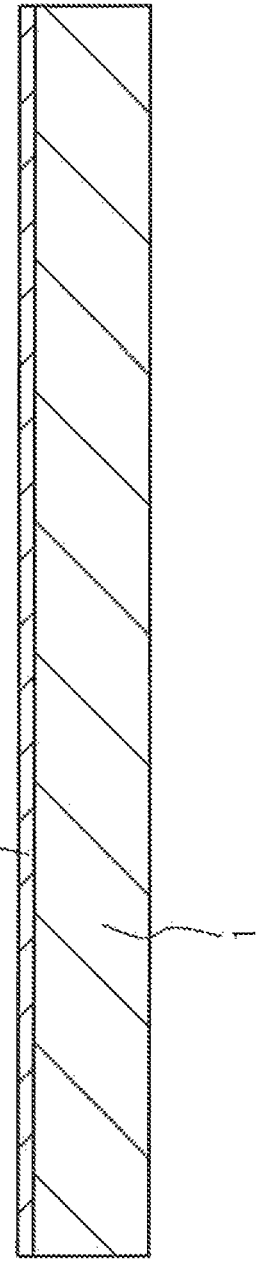

As shown in FIG. 6A, a resist mask having an opening in the region where the n-electrode 11 is to be formed is formed on the protection film 14, and the portion of the protection film 14 exposed through the opening is then removed by wet etching using buffered hydrofluoric acid BHF. The n-electrode 11 formed with a AuGeNi alloy and a metal such as Au is formed on the lower clad layer 2 by a liftoff technique using metal vaporization and a resist mask.

Figure 7A:
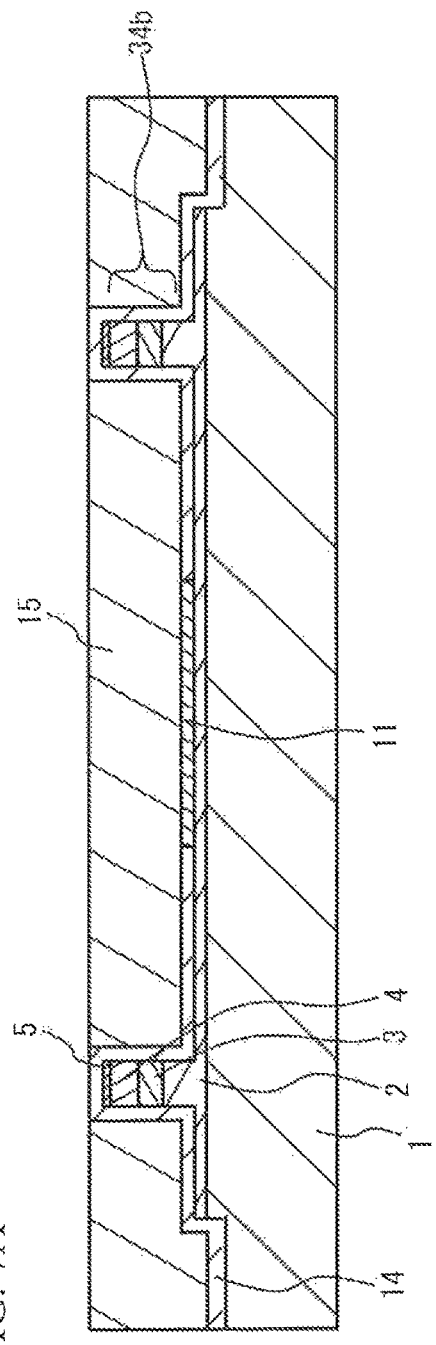
FIGS. 7A and 7B are cross-sectional diagrams illustrating the method of manufacturing the semiconductor optical element according to the first embodiment.
Figure 7B:
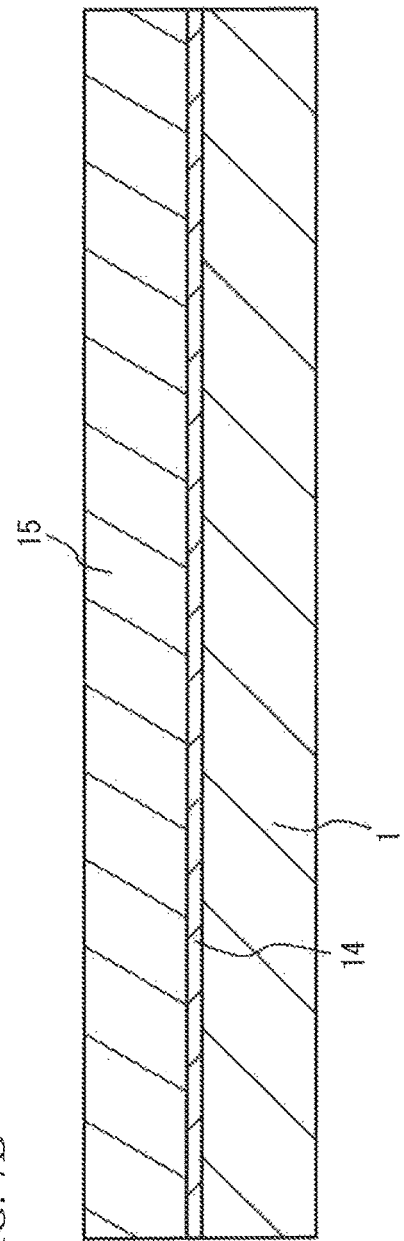

As shown in FIGS. 7A and 7B, spin coating is performed with a precursor to BCB resin to form the first resin layer 15. The number of revolutions in the spin coating is adjusted so that the protection film 14 on the mesa of each of the arm waveguides 34a and 34b is exposed when the coating is completed. After the spin coating, the precursor to the BCB resin is thermally hardened at a high temperature of about 350 degrees C., to form the first resin layer 15. Alternatively, after the first resin layer 15 having a thickness that is greater than the mesa height is formed, an etchback process may be performed on the BCB by dry etching, to expose the protection film 14 on each mesa. As shown in FIG. 7B, the first resin layer 15 having the same thickness as that in FIG. 7A is formed.

Figure 8A:
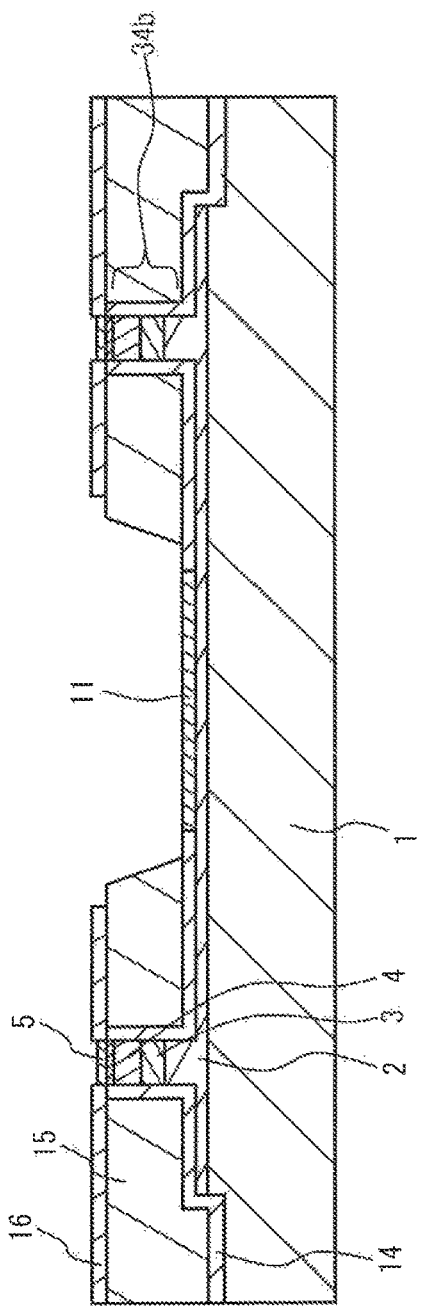
FIGS. 8A and 8B are cross-sectional diagrams illustrating the method of manufacturing the semiconductor optical element according to the first embodiment.
Figure 8B:
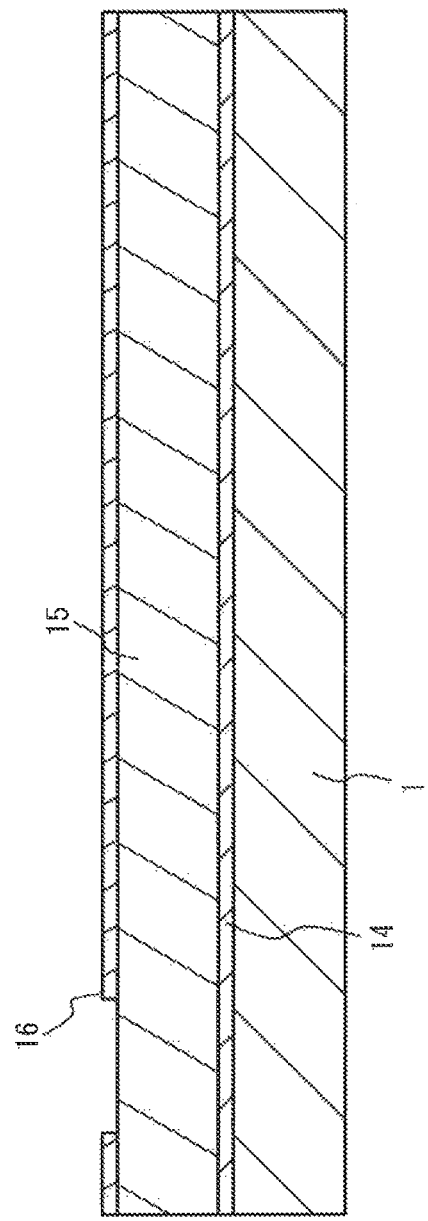

The first inorganic film 16 is formed on the first resin layer 15. As shown in FIG. 8A, an opening is formed in the protection film 14 on each of the arm waveguides 34a and 34b, and a metal (Ti/Pt/Au) to form the ohmic layer 6 is provided on each of the arm waveguides 34a and 34b by vapor deposition and a liftoff technique. A resist mask is formed on the first inorganic film 16. With the resist mask, dry etching is performed on the first inorganic film 16 and the first resin layer 15, so that openings are formed in the first inorganic film 16 and the first resin layer 15, and the ohmic layers 6 and the n-electrode 11 are exposed. As shown in FIG. 8B, an opening is also formed in the first inorganic film 16 at the portion where a scribe line SL is to be formed.

As shown in FIG. 9A, the first foundation layers 7 are formed on the ohmic layers 6, and the foundation layer 12 is formed on the n-electrode 11. The first foundation layers 7 and the foundation layer 12 may be simultaneously formed by the same sputtering process. The first foundation layers 7 may extend onto the first inorganic film 16. The first Au layers 8 are formed on the first foundation layers 7 by plating, and the Au layer 13 is formed on the foundation layer 12 by plating. The first Au layers 8 and the Au layer 13 may be simultaneously formed by the same plating process. Also, as shown in FIG. 9B, in the region where a bonding pad 38 is to be provided, the first foundation layer 7 is formed on the protection film 14, and the first Au layer 8 is formed on the first foundation layer 7 by plating.

As shown in FIGS. 10A and 10B, the openings in the first resin layer 15 and the first inorganic film 16 are filled with a precursor to the BCB resin to form the second resin layer 17 by spin coating. The precursor to the BCB resin fills the openings in the first resin layer 15, and has such a viscosity that the upper surface of the resin becomes flat after the coating. The number of revolutions in the spin coating is also adjusted so that the thickness of the region extending from the upper surface of each ohmic layer 6 to the upper surface of the second resin layer 17 becomes 1.3 μm. The thickness of the second resin layer 17 on each Au layer 8 is preferably 0.5 μm or bigger. The precursor to the BCB resin is thermally hardened at approximately 300 degrees C., to form the second resin layer 17. The second inorganic film 18 is formed on the upper surface of the second resin layer 17 by CVD or the like. At this point, the first resin layer 15 is also subjected to a high temperature of 300 degrees C. The first resin layer 15 goes through two thermal hardening treatments at a high temperature of about 350 degrees C. and a high temperature of about 300 degrees C. As a result, the first resin layer 15 becomes harder than the second resin layer 17, and becomes preferable as the foundation for the bonding pads 38.

As shown in FIG. 11A, a resist mask is formed on the second inorganic film 18, and dry etching is performed on the second inorganic film 18 and the second resin layer 17, to form the openings for exposing the second Au layers 10 of the arm waveguides 34a and 34b and the second Au layer 10 in the region where a bonding pad 38 is to be formed. The amount of etching to be performed on the second resin layer 17 to form each etching is the same on the arm waveguides 34a and 34b and on the region where the bonding pad 38 is to be formed. In this embodiment, the amount of etching is 1.3 μm. The thickness of the portion of the resin layer to be removed to expose the portion where a bonding pad is to be formed is smaller than that in a case where the bonding pads 38 are formed directly on the substrate 1.

Another resist mask is then formed on the second inorganic film 18, the exposed ohmic layers 6, and the exposed n-electrode 11. With this resist mask, dry etching is performed on the first resin layer 15, the second resin layer 17, the first inorganic film 16, and the protection film 14 in the region where a scribe line SL is to be formed, and thus, an opening is formed, as shown in FIG. 11B. The substrate 1 is exposed through this opening. The thickness of the resin layer on which etching is performed to form the opening is at least twice greater than the thickness of the resin layer on which etching is performed in the regions located on the arm waveguides 34a and 34b and in the region where the bonding pad 38 is to be formed. Therefore, another resist mask in addition to the resist mask for forming the opening is used, and dry etching processes are performed separately from each other. Through these processes, the scribe line SL is formed.

Figure 12A:
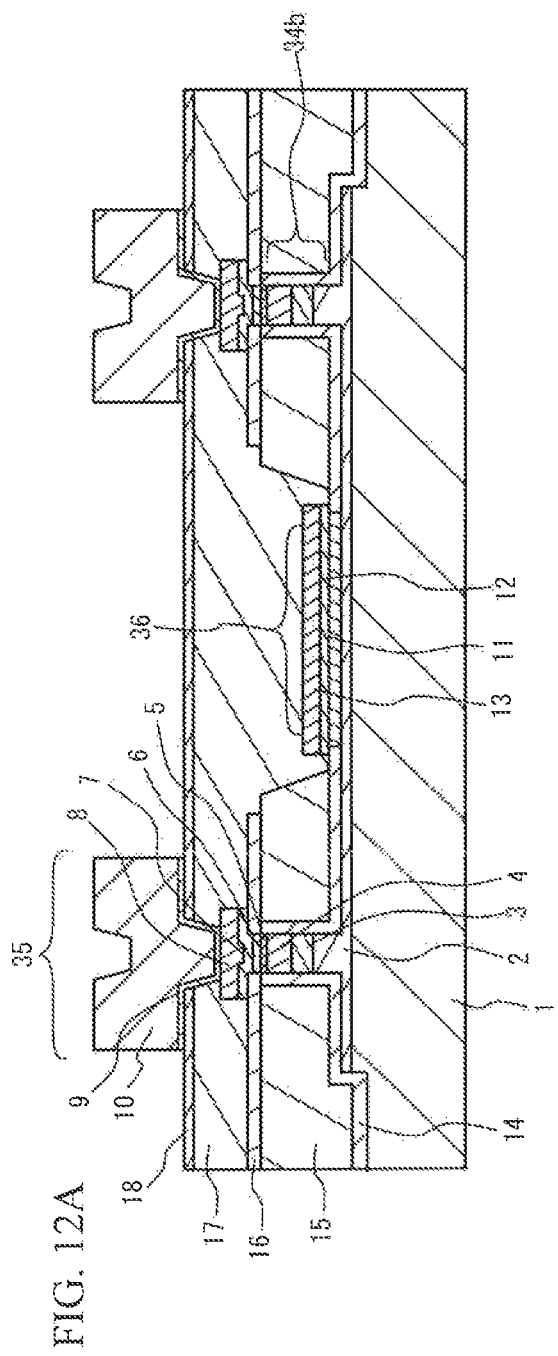
FIGS. 12A and 12B are cross-sectional diagrams illustrating the method of manufacturing the semiconductor optical element according to the first embodiment.
Figure 12B:
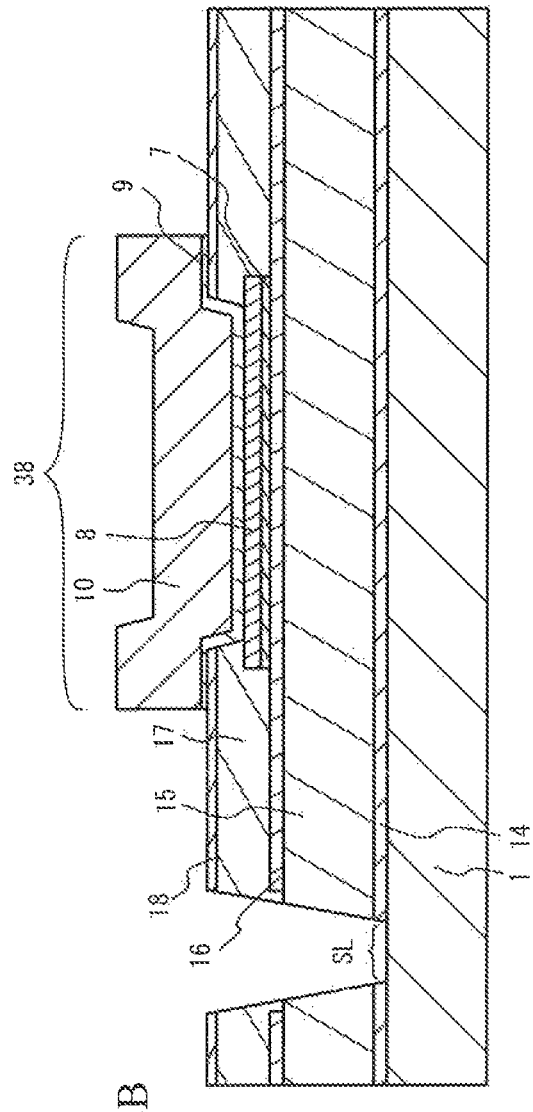

As shown in FIGS. 12A and 12B, the second foundation layers 9 are formed in the region where the connecting wiring lines 41 are to be formed on the second inorganic film 18, in the openings in the second inorganic film 18 and the second resin layer 17 located on the arm waveguides 34a and 34b, and in the openings in the second inorganic film 18 and the second resin layer 17 located on the region where the bonding pad 38 is to be formed. The second foundation layers 9 are formed by sputtering. The second Au layers 10 are formed on the second foundation layers 9 by plating. The plating time or the like is adjusted, so that the thickness of each second Au layer 10 becomes greater than the thickness of the second resin layer 17. In this embodiment, the thickness of the second Au layers 10 is 4.5 μm on the second inorganic film 18. With this arrangement, the connecting wiring lines 41, the bonding pad 38, and the modulation electrodes 35 are not affected by the steps formed by the second resin layer 17 and the openings, and are electrically connected without fail.

Figure 13A:
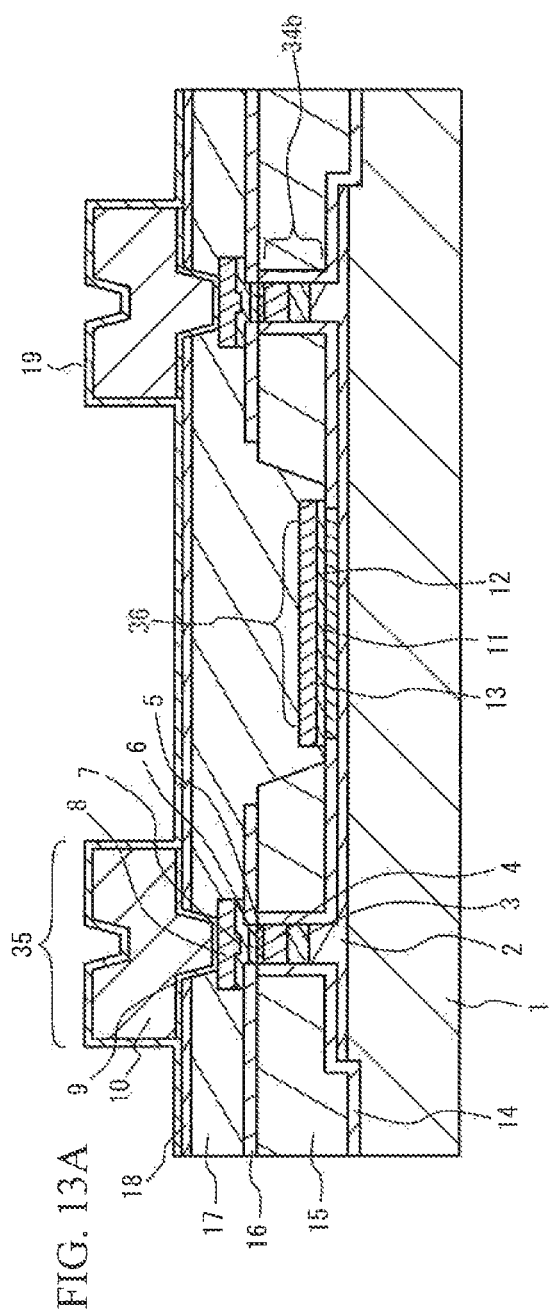
FIGS. 13A and 13B are cross-sectional diagrams illustrating the method of manufacturing the semiconductor optical element according to the first embodiment.
Figure 13B:
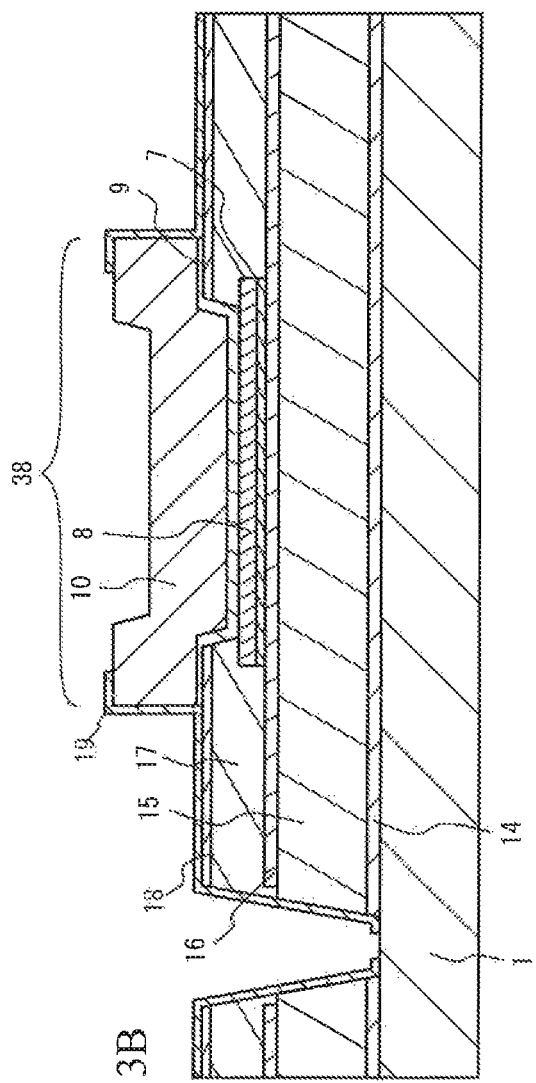

As shown in FIG. 13A, the third inorganic film 19 is then formed to cover the second Au layer 10, the second inorganic film 18, and the opening for the scribe line SL. The portions of the third inorganic film 19 located on the central portion of the upper surface of each second Au layer 10 and in the opening for the scribe line SL are removed. However, the portions of the third inorganic film 19 located on the peripheral portions of the upper surfaces of the second Au layers 10 are not removed. Through the above processes, the optical modulator 100 according to the first embodiment can be manufactured.

Second Embodiment

Figure 14:
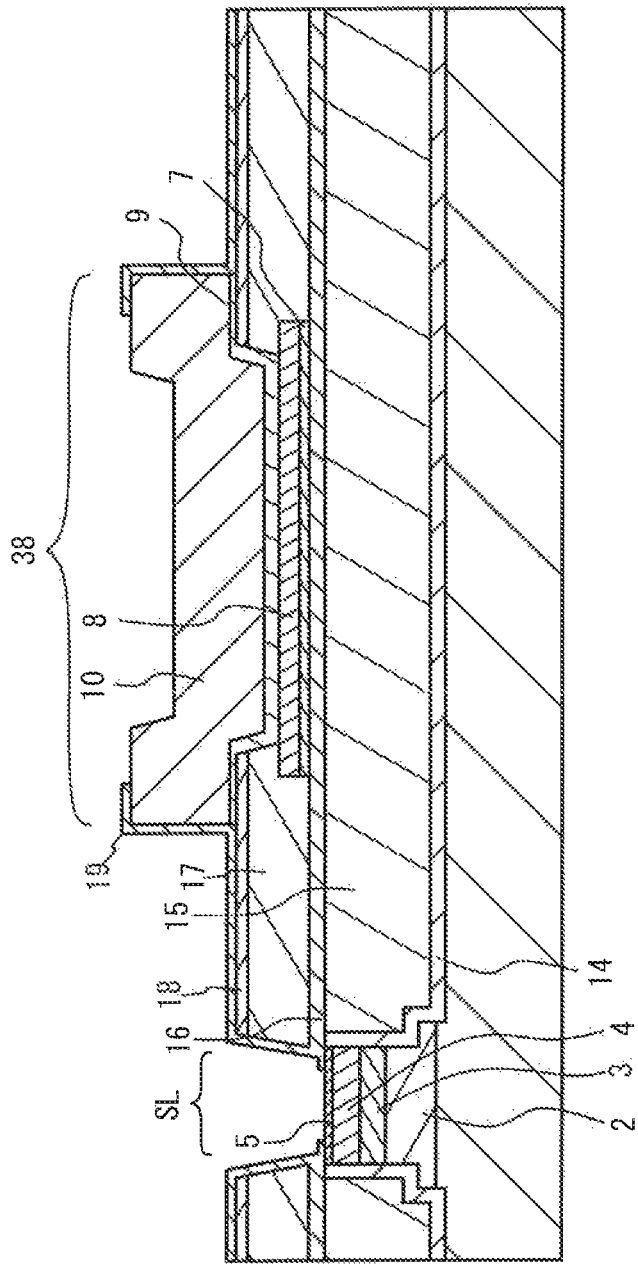
FIG. 14 is a diagram for explaining a second embodiment.

FIG. 14 is a diagram for explaining a second embodiment. FIG. 14 is equivalent to a cross-sectional view taken along the line B-B defined in FIG. 2. In this embodiment, a semiconductor structure that is the same as the mesa-shaped waveguide of each of the arm waveguides 34a and 34b is provided in the region for a scribe line SL. That is, in the scribe line SL, a lower clad layer 2, a core layer, 3, an upper clad layer 4, and a contact layer 5 are stacked on a substrate 1. The upper surface of the contact layer 5 is exposed.

In this embodiment, the contact layer 5 of the scribe line SL is partially scribed, so that the contact layer 5, the upper clad layer 4, the core layer 3, the lower clad layer 2, and the substrate 1 can be cleaved along the scribed portion of the contact layer 5, and chips can be linearly and easily divided.

To obtain the structure shown in FIG. 14, a mesa-shaped semiconductor stack structure is also formed in the region to be the scribe line SL in the mesa-shaped waveguide formation process of the first embodiment. The width of the mesa to be formed in the region of the scribe line SL is approximately 60 μm, for example.

For example, in the process of performing dry etching on the second inorganic film 18 and the second resin layer 17 as in the process shown in FIG. 11A, the contact layer 5 in the region of the scribe line SL should be exposed. This is possible because the difference between the thickness of the resin layer to be removed to expose the contact layer 5 and the thickness of the resin layer to be removed to expose the second Au layer 10 is small. This eliminates the need to form another resist mask for etching.

EXAMPLES

A bonding pad 38 was created according to the above embodiment.

Example 1

In Example 1, the bonding pad described above with reference to FIG. 4 was created as shown in FIG. 15A. Semi-insulating InP of 600 μm in thickness was used as the substrate 1. A SiON or $SiO_2$ film of 200 nm in thickness was used as the protection film 14. A BCB layer of 4 μm in thickness was used as the first resin layer 15. A SiON film of 200 nm in thickness was used as the first inorganic film 16. A TiW layer of 50 nm in thickness was used as the first foundation layer 7. A gold (Au) layer of 4 μm in thickness was used as the first Au layer 8. A TiW layer of 50 nm in thickness was used as the second foundation layer 9. A gold (Au) layer of 4 μm in thickness was used as the second Au layer 10. A BCB layer of 2.5 μm in thickness was used as the second resin layer 17. A $SiO_2$ film of 300 nm in thickness was used as the second inorganic film 18. A SiON/SiN film of 500 nm in thickness was used as the third inorganic film 19.

Comparative Example 1

As shown in FIG. 15B, in Comparative Example 1, the second foundation layer 9 was formed on the first resin layer 15, and the second Au layer 10 was formed on the second foundation layer 9. The thicknesses of the respective layers are the same as those of Example 1.

Comparative Example 2

As shown in FIG. 15C, in Comparative Example 2, the protection film 14 was formed on the substrate 1, the second foundation layer 9 was formed on the protection film 14, and the second Au layer 10 was formed on the second foundation layer 9. The thicknesses of the respective layers are the same as those of Example 1.

With a ball bonder, Au wire was bonded to each of the bonding pads shown in FIGS. 15P, through 15C, and a wire-pull test was conducted. In Comparative Example 1, the second foundation layer 9 was detached from the first resin layer 15 with a tensile strength of 5 gf. This is supposedly because a metallic layer was formed on a resin layer. In Comparative Example 2, the second foundation layer 9 was not detached from the first resin layer 15 until the tensile strength was increased to 12 gf. This is because the adhesion between a semiconductor and an insulating film is high. In Comparative Example 2, however, the step between the bonding pad and the connecting wiring line extending on the resin layer is large, and therefore, it is difficult to connect the connecting wiring line and the bonding pad.

In Example 1, on the other hand, the second foundation layer 9 was not detached from the first resin layer 15 until the tensile strength was increased to 12 gf, though the bonding pad was formed on the first resin layer 15. This is supposedly because the second resin layer 17 covering part of the side surfaces of the bonding pad contributed to the increase in the adhesion between the first resin layer 15 and the bonding pad. In the structure of Example 1, the step between the connecting wiring line extending on the second resin layer 17 and the bonding pad can be made smaller, and thus, the connection between the connecting wiring line and the bonding pad can be facilitated.

What is claimed is:
1. A semiconductor optical element, comprising:
    a mesa-shaped optical waveguide formed on a substrate;
    a modulation electrode formed on the optical waveguide;
    a first resin layer that buries side surfaces of the optical waveguide;
    a bonding pad formed on the first resin layer; and
    a connecting wiring line that connects the modulation electrode and the bonding pad, wherein
    side surfaces of the bonding pad are partially covered with a second resin layer provided on the first resin layer, and
    the connecting wiring line extends on the second resin layer.
2. The semiconductor optical element of claim 1, wherein the bonding pad has a structure in which an upper region is stacked on an upper surface of a lower region, in a stacking plane between the lower region and the upper region, a width of the upper region is smaller than a width of the lower region, and a region where the upper region is not provided on the upper surface of the lower region is covered with the second resin layer.

3. The semiconductor optical element of claim 1, wherein a thickness of the upper region is greater than a thickness of the second resin layer.

4. The semiconductor optical element of claim 1 further comprising a first inorganic film between the first resin layer and the bonding pad.

5. The semiconductor optical element of claim 4, further comprising:

a second inorganic film, provided on the second resin layer; and a third inorganic film provided on the second inorganic film, wherein the bonding pad extends to an upper surface of the second resin layer, and a rim of a portion of the bonding pad is vertically interposed between the second inorganic film and the third inorganic film, the portion of the bonding pad extending the upper surface of the second resin layer.

6. The semiconductor optical element of claim 1, wherein the first resin layer is harder than the second resin layer.

7. The semiconductor optical element of claim 1, further comprising a semiconductor structure having a semiconductor stack structure that is the same as a semiconductor stack structure of the mesa-shaped optical waveguide, wherein the semiconductor structure is provided on the substrate at a portion between a side surface of the semiconductor optical element and the bonding pad.

8. A semiconductor optical element manufacturing method, comprising the steps of:

burying side surfaces of a mesa-shaped optical waveguide with a first resin layer, the mesa-shaped optical waveguide being provided on a substrate;

forming a modulation electrode on the optical waveguide;

forming a bonding pad on the first resin layer;

forming a second resin layer on the first resin layer; and forming a connecting wiring line that connects the modulation electrode and the bonding pad, and extends on the second resin layer, wherein, when the second resin layer is formed, side surfaces of the bonding pad are partially covered with the second resin layer.

9. The semiconductor optical element manufacturing method of claim 8, wherein the step of burying the side surfaces with the first resin layer includes subjecting the first resin layer to thermal hardening treatment, and the step of forming the second resin layer includes subjecting the second resin layer to thermal hardening treatment.

* * * * *